(12) United States Patent
Dreps et al.

(10) Patent No.: US 7,521,968 B2
(45) Date of Patent: Apr. 21, 2009

(54) SLEW RATE CONTROL FOR DRIVER CIRCUIT

(75) Inventors: Daniel M. Dreps, Georgetown, TX (US); John C. Schief, Austin, TX (US); Glen A. Wiedemeier, Austin, TX (US); Joel D. Ziegelbein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 11/055,852

(22) Filed: Feb. 11, 2005

(65) Prior Publication Data

US 2006/0181302 A1  Aug. 17, 2006

(51) Int. Cl.
*H03K 19/0175* (2006.01)
(52) U.S. Cl. .......................... 326/86; 326/83
(58) Field of Classification Search ................ 326/26, 326/27, 83, 86, 87
See application file for complete search history.

(56) References Cited

U.S. PATENT DOCUMENTS 6,160,416 A * 12/2000 Adduci et al. ................. 326/21
6,172,525 B1 * 1/2001 Wennekamp ................ 326/83

\* cited by examiner

*Primary Examiner*—Don P Le
(74) *Attorney, Agent, or Firm*—Casimer K. Salys; Winstead P.C.

(57) ABSTRACT

The slew rate of signals output from an integrated circuit is selectively controlled to optimize the quality of the output data signal depending upon whether the communication channels require a faster or slower slew rate. Faster slew rates may be utilized when the communication channels are prone to attenuation, while slower slew rates may be implemented in the communication channels when crosstalk is more of a concern.

11 Claims, 5 Drawing Sheets

SLEW RATE CONTROL FOR DRIVER CIRCUIT

TECHNICAL FIELD

The present invention relates in general to driver circuitry, and in particular, to the driving of signals from an integrated circuit onto communication channels.

BACKGROUND INFORMATION

Microprocessors and other integrated circuitry ("chips") are amazing feats of technology, but are of no use unless the information processed within such chips is accessible to other circuitry and eventually the humans that use such technology. Computer systems and devices that make use of integrated circuitry rely upon the accurate communication of information between chips, which are either combined on a multi-chip module or are communicating to other circuitry not on the same chip module. Moreover, the speed of such interchip communications is being stretched to the limits by which the signals can be accurately conveyed across the input/output ("I/O") communication channels between such chips. Since the overall processing speed of a system is only as good as its slowest link, much emphasis is placed upon speeding up these interchip I/O communication channels (hereinafter merely referred to as "communication channels").

Leakage of signals from one conductor (communication channel) to another is referred to as crosstalk, which becomes more prevalent as the speed of the communication signals along these conductors increases. This problem is especially a concern in modern flip-chip packaging placed on multi-chip modules. With modern processors, the number of communication channels increases dramatically as the number of peripherals needed for the processor to communicate with increase. Of these channels, some link chips together without ever going off the module, while others link chips where one chip is not on the module. In either case, the number of communication channels leaving the chip is increasing. All of these signals have the potential to interfere with one another. On the links that do not leave the module, the communication channels remain densely packed with one another compounding the crosstalk of these signals. The communication channels that leave the module may connect through large vias to a circuit board and then across the circuit board to another module. In this case, the channels spread out from one another, but the attenuation of the signals on the communication channels is much greater. The result is far less crosstalk, but much greater channel signal attenuation.

Crosstalk is directly related to the slew rate of the signals coming out of the driver connected to the communication channels. If the driver has a fast slew, then more crosstalk is generated, while a slower slew rate results in less crosstalk. FIG. 1 illustrates a data eye pattern of signals on a communication channel where the driver has driven the output signals with a slew rate 101. FIG. 2 shows another data eye pattern where the slew rate 201 is faster than the slew rate 101. It is desirable to have slower slew rates, but with such slower slew rates, the data eye collapses to the point where there is no longer any valid data. In other words, the receiving chips on the far end of the communication channels are unable to distinguish the data signals from noise signals. Referring to FIG. 4, illustrating a multi-chip module 401, it becomes a balancing act for the chip designer who desires a slower slew rate on the communication channels 404 between chips 402 and 403, but only slow enough to minimize the crosstalk induced on the channels 404, while keeping the data eye large enough for successful communications. However, referring to FIG. 5, slower slew rates between off-chip modules, such as chips 501 and 502, results in too much attenuation of the signals along the communication channels 503. With off-chip communications, it is thus desired to have a faster slew rate to therefore communicate signals using a "wider" data eye, such as the one illustrated in FIG. 2.

As can be appreciated, one size does not fit all, and thus different driver circuitry designs are needed depending upon the crosstalk and attenuation characteristics of the communications channels by which the signals will travel in a particular system architecture. For example, a driver circuitry design might be ideal for communications between chips not on the same chip module, but if implemented in the multi-chip module 401 for the communication channels 404, the highly capacitive characteristics of such communication channels 404 might result in a distortion 301 in the data eye as illustrated in FIG. 3.

Chip designers do not always know what system configurations their chips will eventually be implemented in, and thus it would be desirable to have a common solution for driver circuitry, which could be used with either communications between chips on the same module or off-chip communications.

SUMMARY OF THE INVENTION

The present invention addresses the foregoing need by implementing a single design topology for driver circuitry which incorporates a selective slew rate control in the driver circuitry. With such a selective slew rate control, the system designer can select the slew rate to optimize signals along communication channels between chips. A faster slew rate can be programmed into the driver circuitry when crosstalk is not a significant concern, but channel attenuation is, while slower slew rates can be programmed into the driver circuitry when crosstalk is a significant concern to the system designer, such as when the signals are to be communicated between chips on a multi-chip module.

Selecting a slew rate within the driver circuitry may be implemented by effectively increasing or decreasing the equivalent gate width of field effect transistor pass gates used within the driver circuitry. Increasing the number of pass gates used results in a faster slew rate, while decreasing the number of pass gates used for driving the data signal reduces the slew rate.

The foregoing has outlined rather broadly the features and technical advantages of the present invention in order that the detailed description of the invention that follows may be better understood. Additional features and advantages of the invention will be described in the following description.

BRIEF DESCRIPTION OF THE DRAWINGS

For a more complete understanding of the present invention, and the advantages thereof, refer to the following description and the accompanying drawings, in which.

DETAILED DESCRIPTION

Figure 1:
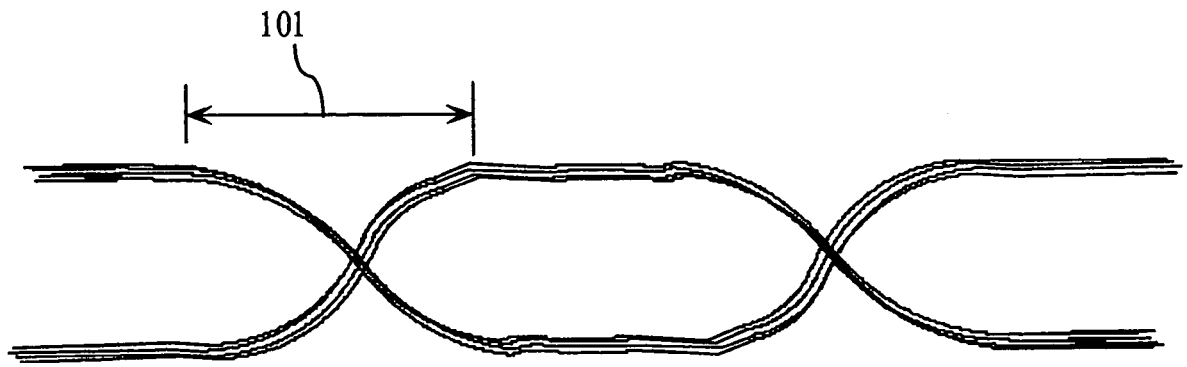
FIG. 1 illustrates a data eye with a slower slew rate.
Figure 2:
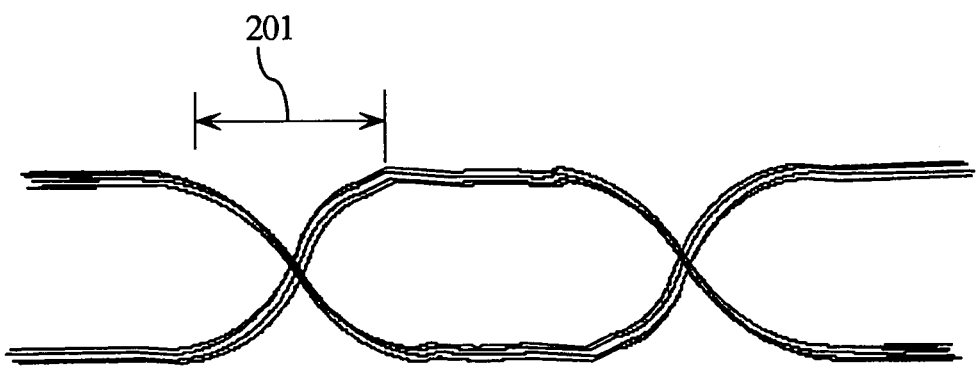
FIG. 2 illustrates a data eye with a faster slew rate.
Figure 3:
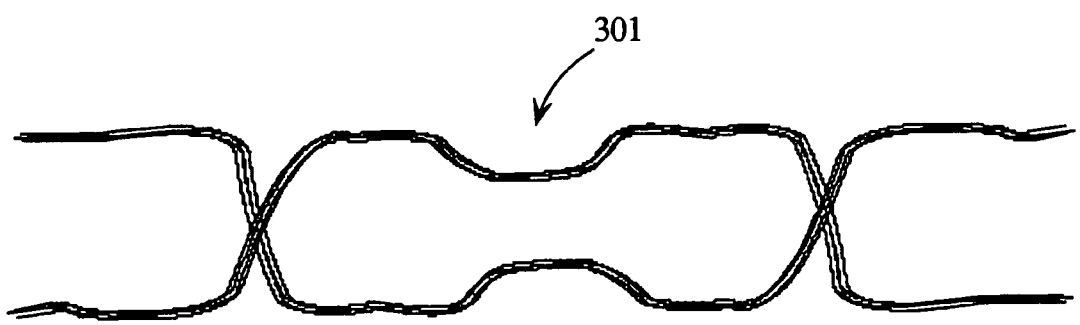
FIG. 3 illustrates a data eye distorted by capacitive crosstalk.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements may be designated by the same reference numeral through the several views.

The present invention may be implemented in complementary metal oxide semiconductor ("CMOS") field effect transistors ("FET"), particularly utilizing P-channel FETs and N-channel FETs (PFETs and NFETs). However, the concepts described herein could be utilized with other architectures where slew rates of transmitted signals need to be selectively controlled. The embodiments described herein use the basic concept of voltage mode push-pull drivers to drive signals from integrated circuitry, and utilize a PFET that pushes a logic 1 onto the communication channel, and an NFET that pulls the communication channel down to a logic 0. The slew rate control mechanism described herein pertains to the rate at which the PFET is turned on and the NFET is turned off. The present invention provides circuitry for selectively controlling the rate the PFET and NFET turn on so that for on-module communication channels, or nets, the rate is slower than for off-module nets, where it is desired to have a faster slew rate.

Figure 4:
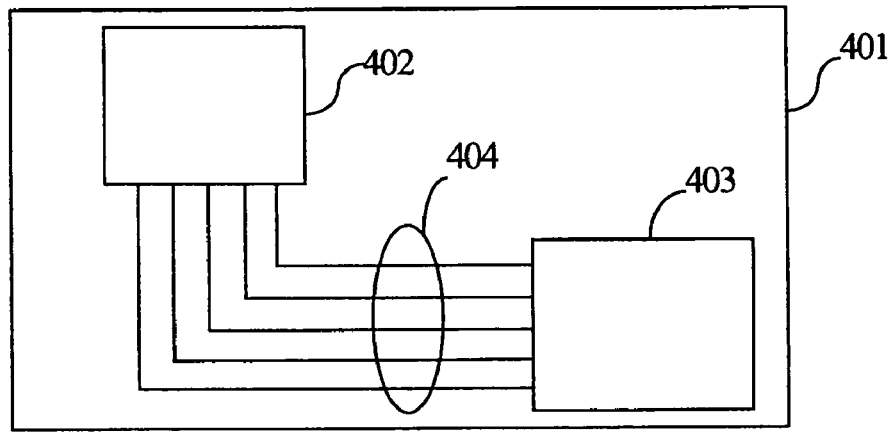
FIG. 4 illustrates a multi-chip module.
Figure 5:
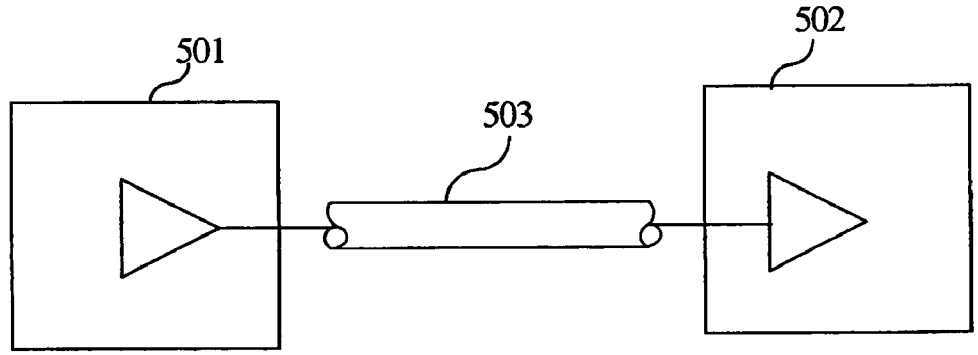
FIG. 5 illustrates communication signals being transmitted off chip.
Figure 6:
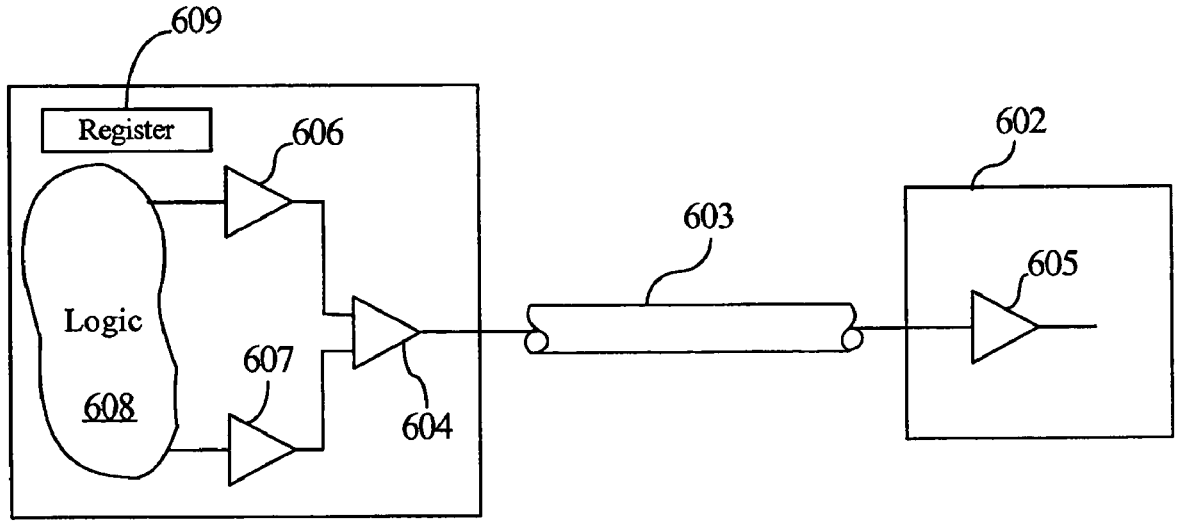
FIG. 6 illustrates a block diagram configured in accordance with an embodiment of the present invention.

Referring to FIG. 6, there is illustrated chips 601 and 602, where chip 601 sends signals over communication channel 603 to chip 602 to be received by receiver 605. Chips 601 and 602 could be implemented by a multi-chip module, such as illustrated in FIG. 4, or could be communicating in an off-chip configuration, such as illustrated in FIG. 5. Thus, communication channel 603 could be densely packed with other channels in a multi-chip module configuration, such as multi-chip module 401, where crosstalk is a significant concern for the system designer. Or, communication channel 603 could be spread out from other channels to thus diminish the crosstalk concerns, but the length of communication channel 603 may be sufficiently long that attenuation of the data signals is a concern for the designer.

Chip 601 includes a driver 604, which is described below in further detail with respect to FIG. 9. Driver 604 receives data signals from pre-drive circuits 606 and 607, which receive data signals from logic circuitry 608. In the embodiment illustrated in FIG. 6, pre-drive circuit 606 is a pull-up pre-drive section, while pre-drive circuit 607 is a pull-down pre-drive section, where both pre-drive circuits 606 and 607 receive the same data signal from logic circuitry 608. Both pre-drive circuits 606 and 607 send their outputs to the driver 604. However, the present invention should not be limited by the configuration illustrated in FIG. 6, but the embodiments described hereinafter with respect to FIGS. 6-9 could be implemented with a single pre-drive circuit feeding the driver 604, or a driver circuitry embodying pre-drive circuitry without out a separate driver circuit.

Figure 7:
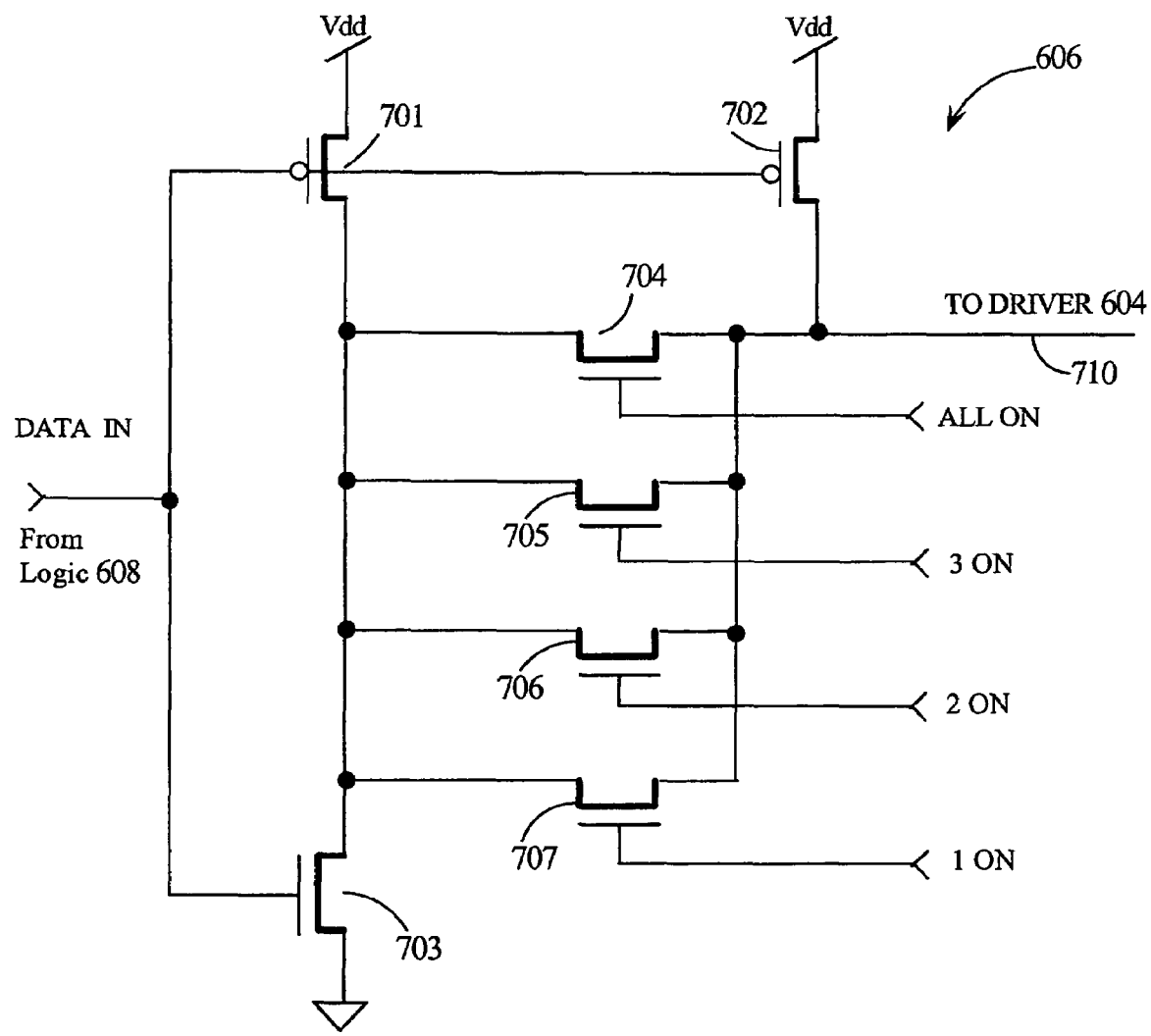
FIGS. 7-8 illustrate pre-drive circuitry configured in accordance with an embodiment of the present invention.

FIG. 7 illustrates pre-drive circuit 606 in further detail. When the DATA IN signal received from logic circuitry 608 transitions from a logic 1 to a logic 0, the PFETS 701 and 702 turn on and push a logic 1 to the output line 710, sending the signal to driver 604. When the DATA IN signal transitions from a logic 0 to a logic 1, the PFETs 701 and 702 turn off, discontinuing pushing of the logic 1 signal onto output line 710. Conversely, referring to the pre-drive circuit 607 in FIG. 8, when the DATA IN signal from logic circuitry 608 is received by circuit 607 and transitions from a logic 0 to a logic 1, the NFETs 802 and 803 turn on and pull the output line 810 to a logic 0. When the DATA IN signal transitions from a logic 1 to a logic 0, the NFETs 802 and 803 turn off and the pulling discontinues. The rate at which a logic 1 is pushed onto the output line 710 in pre-drive circuit 606, and the rate a logic 0 is pulled from the output line 810 on pre-drive circuit 607 is how the slew control (dv/dt) is accomplished in the present invention. The PFETs 701 and 702 act as a load for the pre-drive circuit 606, and the NFETs 802 and 803 act as a load for the pre-drive circuit 607.

In pre-drive circuit 606, the pull-up pre-drive section comprises PFETs 701 and 702, and NFETs 703-707. NFETs 704-707 act as pass gates, which are driven by signals input onto their gate electrodes. The slowest slew rate possible for pre-drive circuit 606 can be accomplished by activating NFET 707 with a logic 1 received at input 1 ON. This gate electrode may be permanently coupled to VDD. The slew rate can be increased by inputting a logic 1 signal to input 2 ON, coupled to the gate electrode of NFET 706. Now both pass gates 706 and 707 are activated. The slew rate can be further increased by activating pass gate 705, and the fastest slew rate can be achieved by having all of pass gates 704-707 activated. When the logic 1 reaches any of the NFETs 704-707, they turn on and allow any voltage built up on the output line 710 to be sunk to ground when NFET 703 is activated. The equivalent gate width determines the rate at which the sinking of the output line 710 takes place. As each NFETs within the group of NFET 704-707 is activated, the equivalent gate width is increased so that the sinking takes place more quickly, thus increasing the slew rate. Naturally, disabling of each NFET reduces the overall gate width so that the slew rate slows down accordingly.

The size of each NFET 704-707 is determined by the granularity at which the chip designer wishes to set up the slew rates. For example, given a nominal process voltage and temperature, having all the pass gates 704-707 activated can be designed to implement a slew rate of 150 picoseconds (ps), while having only pass gates 705-707 activated results in a slew rate of 200 ps, while having only pass gates 706-707 activated results in a slew rate of 250 ps, and the slowest slew rate is achieved with only pass gate 707 activated, with a rate of 300 ps. Further, the sizes of the NFETs 704-707 do not all have to be equal, but could be designed so that the incremental slew rate can be of any desired increment depending upon the combination of pass gates 704-707 activated.

PFET 702 operates to send a logic 1 to the pullup drive section, thus turning the pullup drive off. PFET 701 operates as a shunt of excess energy to thereby set up the NFETs 703-707 for the next cycle, thus minimizing inter-symbol interference.

Figure 8:
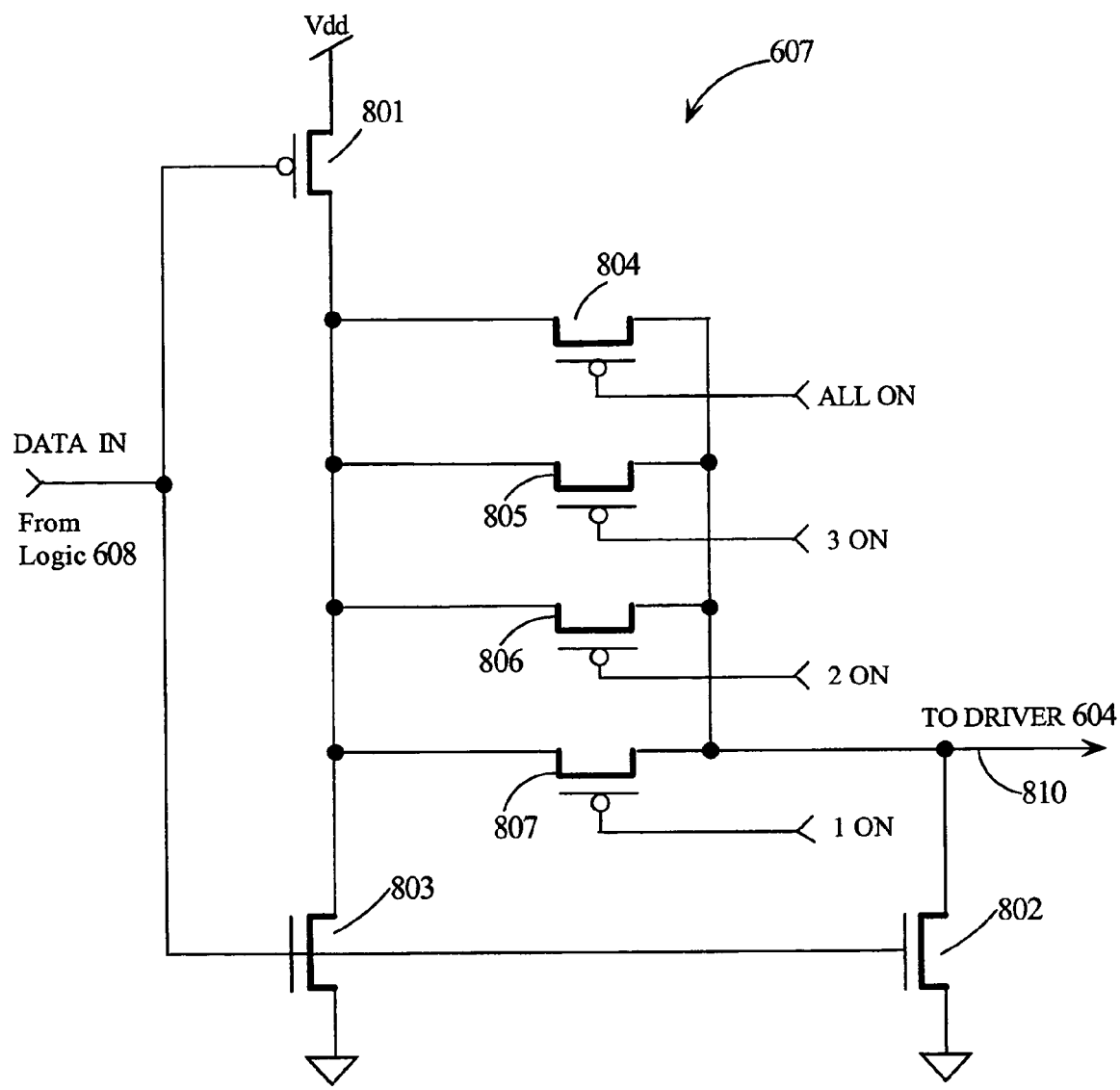

Referring to FIG. 8, pre-drive circuit 607 acts in a similar manner as pre-drive circuit 606, except that instead of the rate of which a logic 0 is sent to the driver 604, the slew rate for sending a logic 1 to the driver 604 is controlled. NFETs 802 and 803 operate similarly as PFETs 702-701, while PFET 801 operates similar as NFET 703. Pass gates 804-807 operate similarly as pass gates 704-707, and one of the pass gates 804-807 may be permanently tied to ground.

Referring to FIG. 6, a user programmable register 609 may be utilized to determine the values for signals received by inputs 1 ON, 2 ON, 3 ON, and ALL ON. Thus, as an engineer or technician is building their system, and comes across architectures that are multi-chip modules (FIG. 4) or off-chip configurations (FIG. 5), they can select a desired slew rate for the communication channels by programming a number into register 609, that number determining which of the inputs 1 ON, 2 ON, 3 ON, and ALL ON are activated.

Figure 9:
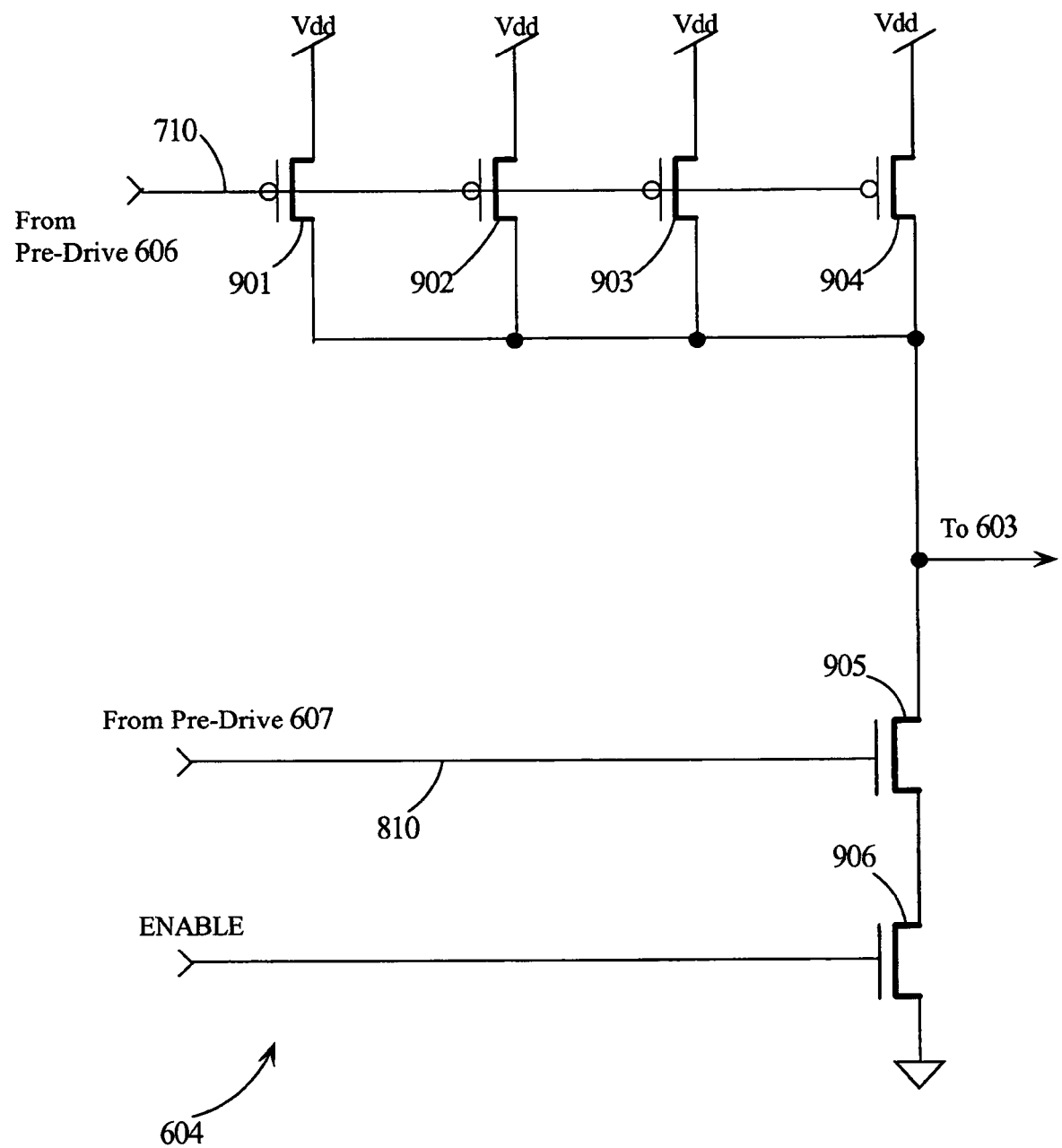
FIG. 9 illustrates a driver receiving pre-drive signals from the circuits illustrated in FIGS. 7-8.

FIG. 9 illustrates further detail of an exemplary embodiment of driver 604, receiving pre-drive signals from pre-drive circuit 606 on input 710, and pre-drive 607 on input 810. The signal received on input 710 from pre-drive circuit 606 is received by the gate electrodes of PFETs 901-904, whose output is coupled to the output of NFET 905 receiving signals on input 810 from pre-drive circuit 607. An enable signal may be received by NFET 906. The driver 604 then outputs the data signal onto communication channel 603.

What is claimed:

1. A driver circuit comprising:
    a data input line;
    a data output line;
    circuitry for driving an output data signal onto the data output line in response to an input data signal received on the data input line; and
    circuitry for selectively varying a slew rate of the output data signal, wherein the selectively varying circuitry further comprises a plurality of pass gates coupled in parallel with each other between the driving circuitry and the data output line, wherein varying combinations of the plurality of pass gates can be activated to vary the equivalent gate width of the parallel pass gates, wherein the slew rate of the output data signal is increased as more ones of the plurality of pass gates are selectively activated.

2. A driver circuit comprising:
    a data input line:
    a data output line; circuitry for driving an output data signal onto the data output line in response to an input data signal received on the data input line; and
    circuitry for selectively varying a slew rate of the output data signal, wherein the selectively varying circuitry further comprises a plurality of pass gates coupled in parallel with each other between the driving circuitry and the data output line, wherein varying combinations of the plurality of pass gates can be activated to vary the equivalent gate width of the parallel pass gates, wherein selective activation of the plurality of pass gates is in response to programming of a register.

3. An integrated circuit having a communication channel for outputting data signals from the integrated circuit, the integrated circuit further comprising:
    logic circuitry outputting the data signals to a driver circuit, the driver circuit receiving the data signals on a data input line, and having a data output line coupled to the communication channel
    the driver circuit comprising circuitry for driving the data signals to the data output line at a specified voltage level, and a plurality of pass gates coupled in parallel with each other between the driving circuitry and the data output line; and
    circuitry for selectively activating one or more of the plurality of pass gates in order to specify a slew rate of the data signals driven to the data output line, wherein the driver circuit further comprises:
    a first PFET having a gate electrode coupled to the data input line, a source electrode coupled to a voltage source having the specified voltage level, and a drain electrode;
    a first NFET having a gate electrode coupled to the data input line, a source electrode coupled to a ground potential, and a drain electrode coupled to the drain electrode of the first PFET;
    a first one of the plurality of pass gates coupled between the drain electrode of the first PFET and the data output line, a gate electrode of the first one of the plurality of pass gates receiving a first slew rate specification signal;
    a second one of the plurality of pass gates coupled between the drain electrode of the first PFET and the data output line, a gate electrode of the second one of the plurality of pass gates receiving a second slew rate specification signal; and
    circuitry for selectively activating each of the first and second slew rate specification signals.

4. The integrated circuit as recited in claim 3, wherein the circuitry for selectively activating each of the first and second slew rate specification signals further comprises a programmable register coupled to the gate electrodes of the first and second ones of the plurality of pass gates.

5. The integrated circuit as recited in claim 3, wherein the plurality of pass gates further comprise NFETs.

6. The integrated circuit as recited in claim 3, wherein the driver circuit further comprises:
    a second PFET having a gate electrode coupled to the data input line, a source electrode coupled to a voltage source having the specified voltage level, and a drain electrode;
    a second NFET having a gate electrode coupled to the data input line, a source electrode coupled to a ground potential, and a drain electrode coupled to the drain electrode of the second PFET;
    a third one of the plurality of pass gates coupled between the drain electrode of the second PFET and the data output line, a gate electrode of the third one of the plurality of pass gates receiving the first slew rate specification signal;
    a fourth one of the plurality of pass gates coupled between the drain electrode of the second PFET and the data output line, a gate electrode of the fourth one of the plurality of pass gates receiving the second slew rate specification signal; and
    circuitry for selectively activating each of the first and second slew rate specification signals.

7. The integrated circuit as recited in claim 6, wherein the circuitry for selectively activating each of the first and second slew rate specification signals further comprises a programmable register coupled to the gate electrodes of the third and fourth ones of the plurality of pass gates.

8. The integrated circuit as recited in claim 3, wherein the plurality of pass gates further comprise PFETs.

9. A multi-chip module comprising:
    a first integrated circuit having a receiver circuit coupled to a chip input;
    a communication channel coupled to the chip input; and
    a second integrated circuit having a driver circuit with a chip output coupled to the communication channel, the driver circuit further comprising:

a first PFET having a gate electrode coupled to the data input line, a source electrode coupled to a voltage source having the specified voltage level, and a drain electrode;

a first NFET having a gate electrode coupled to the data input line, a source electrode coupled to a ground potential, and a drain electrode coupled to the drain electrode of the first PFET;

a first one of the plurality of pass gates coupled between the drain electrode of the first PFET and the data output line, a gate electrode of the first one of the plurality of pass gates receiving a first slew rate specification signal;

a second one of the plurality of pass gates coupled between the drain electrode of the first PFET and the data output line, a gate electrode of the second one of the plurality of pass gates receiving a second slew rate specification signal; and circuitry for selectively activating each of the first and second slew rate specification signals.

10. The multi-chip module as recited in claim 9, wherein the circuitry for selectively activating each of the first and second slew rate specification signals further comprises a programmable register coupled to the gate electrodes of the first and second ones of the plurality of pass gates.

11. The multi-chip module as recited in claim 9, wherein the plurality of pass gates further comprise NFETs.

* * * * *